(12) United States Patent
Wang et al.

(10) Patent No.: US 8,553,387 B2
(45) Date of Patent: Oct. 8, 2013

(54) ELECTRONIC DEVICE

(75) Inventors: Ching-Jen Wang, Taipei (TW);
Fang-Teng Chung, Taipei (TW);
Wen-Hsieh Hsieh, Taipei (TW)

(73) Assignee: Pegatron, Beitou District, Taipei (TW)

( * ) Notice: Subject to any disclaimer, the term of this patent is extended or adjusted under 35 U.S.C. 154(b) by 374 days.

(21) Appl. No.: 13/042,406

(22) Filed: Mar. 7, 2011

(65) Prior Publication Data

US 2011/0317378 A1    Dec. 29, 2011

(30) Foreign Application Priority Data

Jun. 25, 2010 (TW) .............................. 99120864 A

(51) Int. Cl.
*H05F 3/00* (2006.01)
*H05K 1/14* (2006.01)
*H05K 1/11* (2006.01)

(52) U.S. Cl.
USPC ........... 361/212; 361/220; 361/227; 361/737; 361/792; 361/793; 361/794; 361/795; 361/803

(58) Field of Classification Search
USPC .......... 174/261; 361/212, 220, 227, 737, 752, 361/792–795, 800, 803, 816, 818, 753
See application file for complete search history.

(56) References Cited

U.S. PATENT DOCUMENTS

| | | | | |
|---|---|---|---|---|
| 4,532,419 A * | 7/1985 | Takeda | | 235/492 |
| 6,043,989 A * | 3/2000 | Hayakawa et al. | | 361/800 |
| 6,515,871 B1 * | 2/2003 | Stark et al. | | 361/818 |
| 6,753,595 B1 * | 6/2004 | Lin et al. | | 257/668 |
| 6,918,773 B2 | 7/2005 | Chen | | |
| 7,589,405 B2 * | 9/2009 | Son et al. | | 257/678 |
| 8,102,658 B2 * | 1/2012 | Hiew et al. | | 361/737 |
| 2001/0033478 A1 * | 10/2001 | Ortiz et al. | | 361/818 |
| 2004/0233596 A1 * | 11/2004 | Chen et al. | | 361/56 |
| 2007/0111562 A1 * | 5/2007 | Wallace | | 439/74 |
| 2009/0200063 A1 * | 8/2009 | Omerovic | | 174/250 |
| 2009/0237855 A1 * | 9/2009 | Shrier | | 361/126 |
| 2010/0027184 A1 * | 2/2010 | Chen | | 361/220 |

FOREIGN PATENT DOCUMENTS

| | | |
|---|---|---|
| CN | 2930234 Y | 8/2007 |
| JP | 2160593 A | 6/1990 |
| JP | 2006196355 A | 7/2006 |
| TW | 200623973 | 7/2006 |
| TW | M320760 | 10/2007 |
| TW | 200847362 | 12/2008 |

* cited by examiner

*Primary Examiner* — Timothy Thompson
*Assistant Examiner* — Sherman Ng
(74) *Attorney, Agent, or Firm* — Winston Hsu; Scott Margo

(57) ABSTRACT

This invention provides an electronic device including a casing and a circuit board. The casing has an opening. The circuit board is located in the casing and at least includes a conductive layer and a surface insulating layer. The conductive layer includes a signal transmission portion and a static induction portion. The static induction portion is electrically disconnected with the signal transmission portion at the conductive layer, and the static induction portion is closer to the opening than the signal transmission portion. The surface insulating layer covers the signal transmission portion on the circuit board and exposes the static induction portion.

12 Claims, 8 Drawing Sheets

ELECTRONIC DEVICE

CROSS-REFERENCE TO RELATED APPLICATIONS

This Non-provisional application claims priority under 35 U.S.C. §119(a) on Patent Application No(s). 099120864 filed in Taiwan, Republic of China on Jun. 25, 2010, the entire contents of which are hereby incorporated by reference.

BACKGROUND OF THE INVENTION

1. Field of the Invention

This invention relates to an electronic device and, more particularly, to an electronic device with an electrostatic protection function.

2. Description of the Related Art

Since electronic technology is gradually developed due to fast development of science, different kinds of electronic devices have gradually become important media in life of modern people to obtain information and to communicate with others.

In recent years, notebook computers have gradually become one portion of daily life, and many affairs may be executed via the notebook computers. Therefore, different kinds of card readers may be built in most notebook computers for reading data of electronic devices in other different types, such as memory cards of digital cameras or memory cards of mobile phones, thus to store the data in the notebook computers for execution.

However, the weather in European and American areas is dry. Therefore, static electricity is easily generated. Further, since the human body has static electricity, the static electricity may be conducted to an electronic device after a person touches an object. A card reader of a notebook computer is taken for example. The static electricity can be easily conducted to interior of the card reader from an opening of the card reader. If the card reader does not have a device for preventing the static electricity, the static electricity may directly hit a pin nearest to the opening of the card reader and may be conducted to a chip via a signal cable on a circuit board. Since discharge of the static electricity is transient current discharged by surface electric charges, the generated transient voltage may be tens of volts to thousands of volts, and time is between 10 ns to 100 ns. Thereby, the transient large current and voltage difference may damage circuits of the chip and even burn the chip.

At present, the electronic devices on the market mostly have conductive cloth in the plastic casing to conduct and release the static electricity. However, the conductive cloth affects the appearance as exposed to the opening of the casing. In addition, the process for assembling the conductive cloth is time-consuming and laborious. The cost of the material of the conductive cloth is also another manufacturing cost, thereby greatly increasing manufacturing costs of the electronic device.

BRIEF SUMMARY OF THE INVENTION

This invention provides an electronic device including a casing and a circuit board. The casing has an opening. The circuit board is located in the casing and at least includes a conductive layer and a surface insulating layer. The conductive layer includes a signal transmission portion and a static induction portion. The static induction portion is electrically disconnected with the signal transmission portion at the conductive layer, and the static induction portion is closer to the opening than the signal transmission portion. The surface insulating layer covers the signal transmission portion on the circuit board and exposes the static induction portion.

In the invention, the exposed static induction portion of the conductive layer without coating the surface insulating layer is disposed between the pins on the circuit board and the opening of the casing, thereby being closer to the opening of the casing than the signal transmission portion. When negative electric charges of the static electricity exist around the electronic device, the static electricity may be discharged to the ground layer along the static induction portion adjacent to the opening, thus to protect the electronic element on the circuit board free from damage caused by discharge of the static electricity.

Since the conductive cloth is not disposed in the casing according to the invention, the disadvantages in the prior art that the conductive cloth is exposed to the opening of the casing and the assembly of the conductive layer is inconvenient can be solved, further to reduce the material costs and the assembling costs of the electronic device.

These and other features, aspects, and advantages of the present invention will become better understood with regard to the following description, appended claims, and accompanying drawings.

DETAILED DESCRIPTION OF THE INVENTION

Figure 1:
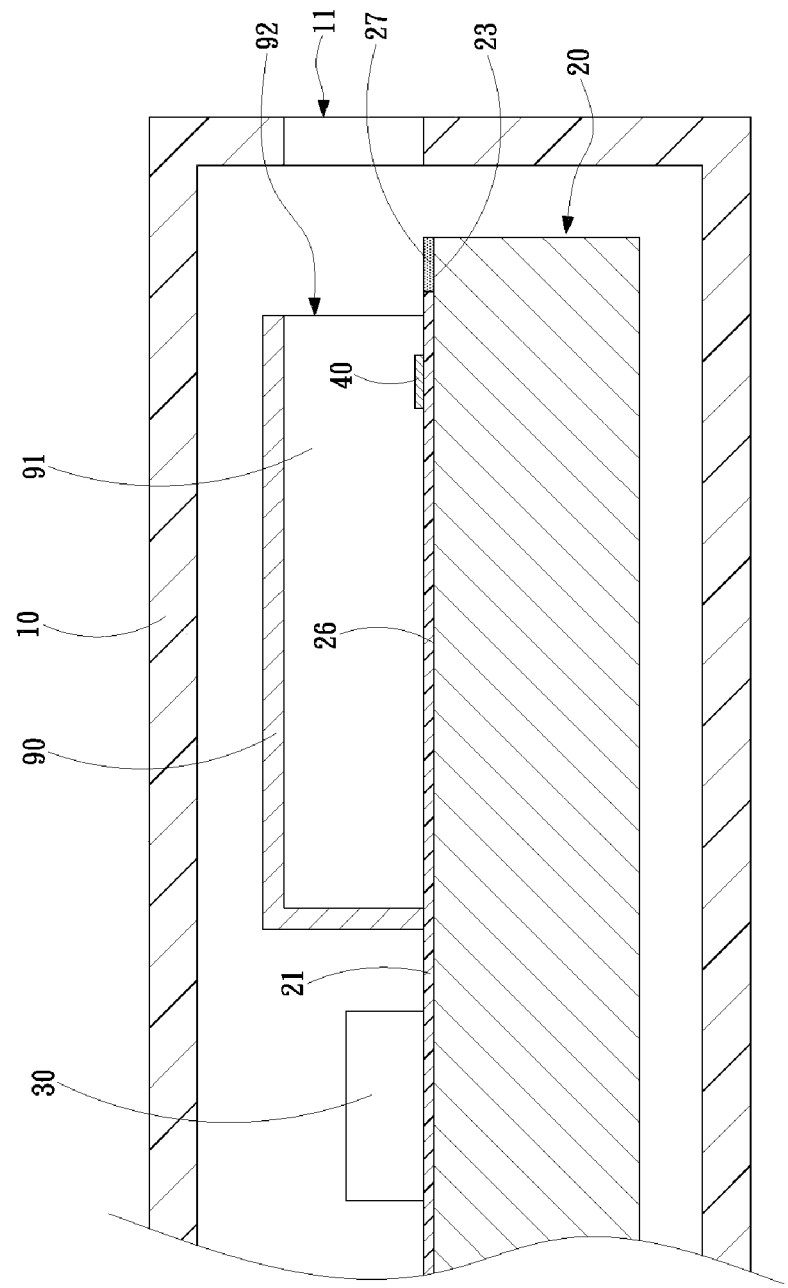
FIG. 1 is a schematic diagram according to a first embodiment of this invention.

FIG. 1 is a schematic diagram according to a first embodiment of this invention. In the embodiment, an electronic device includes a casing 10 and a circuit board 20.

The casing 10 is a rectangular three-dimensional hollow structure. The casing 10 has an opening 11 at one side. The casing 10 is preferably made of plastic. However, the invention is not limited thereto. Besides the plastic, the casing 10 may be made of other non-conductive materials. In addition, the opening 11 is rectangular. However, the location and shape of the opening 11 are just examples. The invention is not limited thereto. For example, in the embodiment a card reader may be taken for example, and the shape and size of the opening 11 correspond to a card which the card reader is to read.

Figure 2:
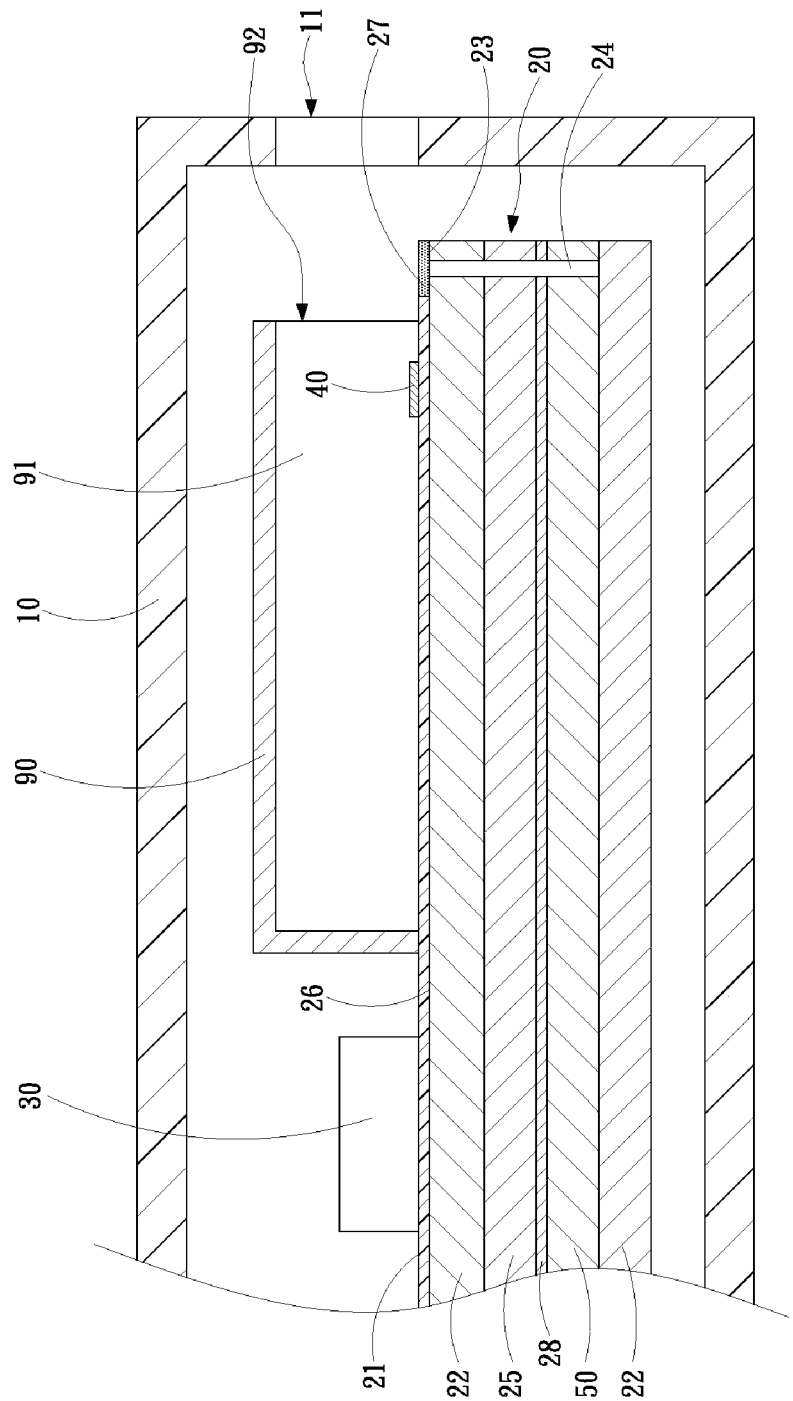
FIG. 2 is a side view showing a circuit board according to the first embodiment of this invention.

FIG. 2 is a side view showing the circuit board 20 according to the first embodiment of the invention. The circuit board 20 is located in the casing 10 and corresponds to the opening 11. Generally speaking, there are a plurality of types and methods for stacking circuit boards in layer, such as a two-layered board, a four-layered board, a six-layered board, or an eight-layered board. In the embodiment, a four-layered board is taken for example. However, the invention is not limited thereto. In FIG. 2, the circuit board 20 is a four-layered board formed by stacking upper and lower conductive layers 22, a ground layer 50, and a power layer 25.

The ground layer 50 is preferably a rectangular sheet and is made of a material with low resistance. The conductive layers 22 are preferably made of copper foil and correspond to the shape of the ground layer 50. One of the conductive layers 22 is stacked on the ground layer 50, and the other conductive layer 22 is stacked under the ground layer 50. The materials and stacking modes of the ground layer 50 and the conductive layer 22 are just examples. However, the invention is not limited thereto.

Figure 3:
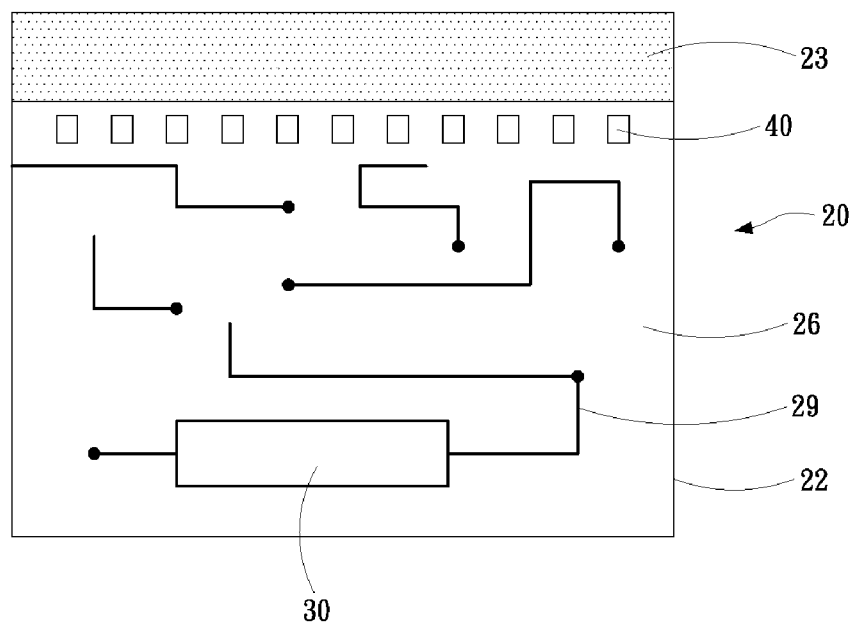
FIG. 3 is a top view showing the circuit board according to the first embodiment of this invention.

FIG. 3 is a top view showing the circuit board 20 according to the first embodiment of the invention. The conductive layer 22 includes a signal transmission portion 26 and a static induction portion 23. The static induction portion 23 is electrically disconnected with the signal transmission portion 26 at the conductive layer 22, and the static induction portion 23 of the conductive layer 22 is closer to the opening 11 of the casing 10 than the signal transmission portion 26. On the surface of the circuit board 20, a surface insulating layer 21 covers the signal transmission portion 26 and exposes the static induction portion 23. In the embodiment, the surface insulating layer 21 is preferably made of a solder mask such as oil ink.

In the embodiment, an electronic element 30 is disposed on the surface insulating layer 21 of the circuit board 20. That is, the electronic element 30 is disposed at a top surface of the circuit board 20, as shown in FIG. 1. However, the invention is not limited thereto. According to needs, the electronic element 30 may be disposed at a bottom surface of the circuit board 20. The electronic element 30 may be an IC chip, a resistor, or a capacitor. However, the invention is not limited thereto.

In the embodiment, the electronic device further includes a plurality of pins 40 made of metal. The pins 40 are disposed on the surface insulating layer 21 and are electrically connected with the signal transmission portion 26. The electronic element 30 is disposed on the surface insulating layer 21 and is electrically connected with the pins 40 via a signal cable 29. Thereby, the static induction portion 23 of the conductive layer 22 is closer to the opening 11 of the casing 10 than the signal transmission portion 26. That is, the static induction portion 23 of the conductive layer 22 is located between the opening 11 of the casing 10 and the pins 40.

Figure 4:
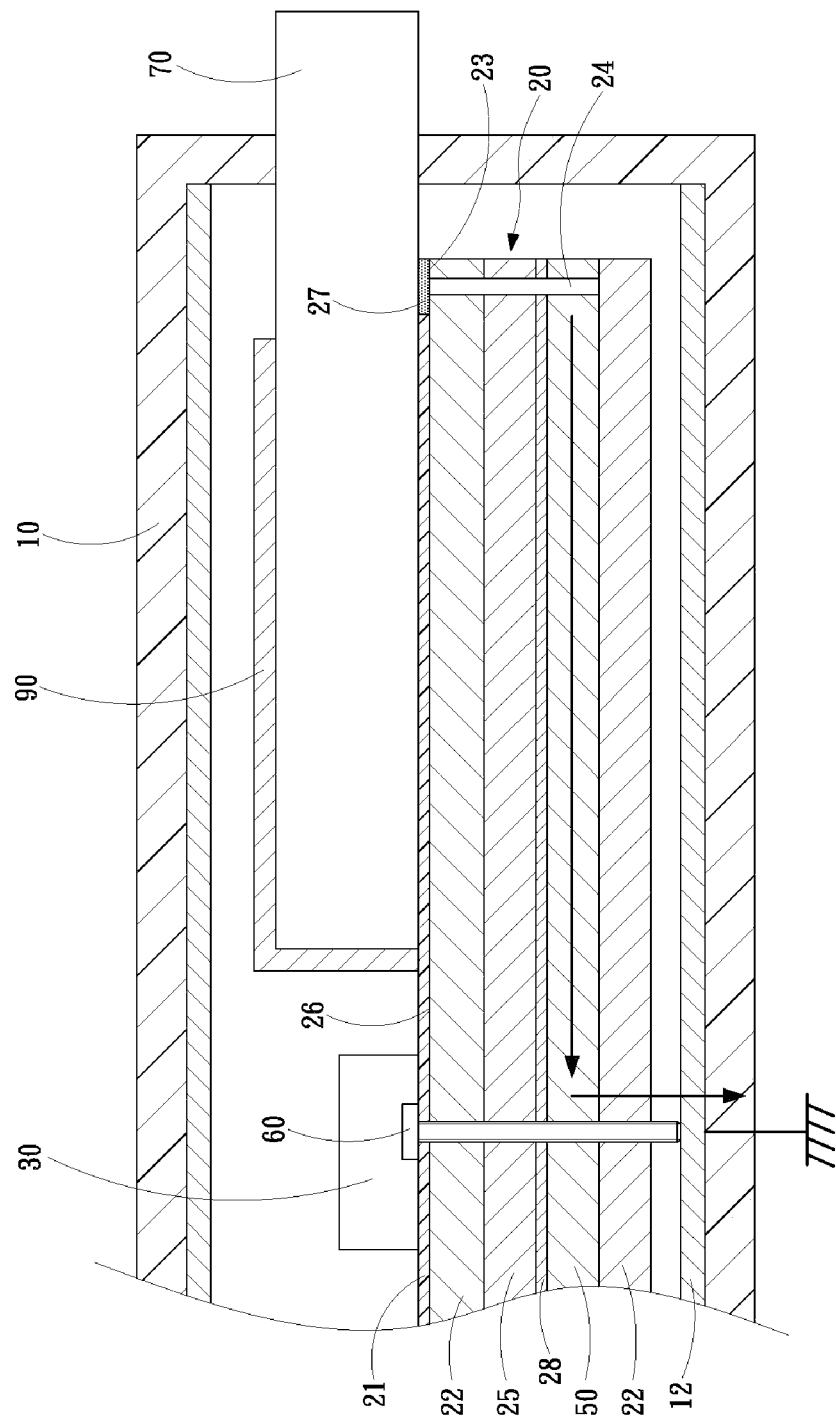
FIG. 4 is a schematic diagram showing a cover where an electronic card is disposed according to a second embodiment of this invention.

FIG. 4 is a schematic diagram showing a cover for containing an electronic card according to a second embodiment of the invention. The electronic device includes a cover 90 disposed on the circuit board 20 and forming a containing space 91 (as shown in FIG. 1). An opening 92 of the containing space 91 corresponds to the opening 11 of the casing 10, such that an electronic card 70 can be inserted via the opening 11 of the casing 10 and be contained in the containing space 91. The cover 90 is preferably made of metal, such as iron or aluminum. However, the invention is not limited thereto. In the embodiment, the cover 90 is used for containing the electronic card 70. For example, when the electronic device in the embodiment is a card reader, the shape and size of the opening 11 correspond to the electronic card 70 which the card reader is to read. At that moment, the electronic card 70 can be inserted via the opening 11 and be contained in the containing space 91 of the cover 90 to fasten the electronic card 70 to the card reader.

Figure 5:
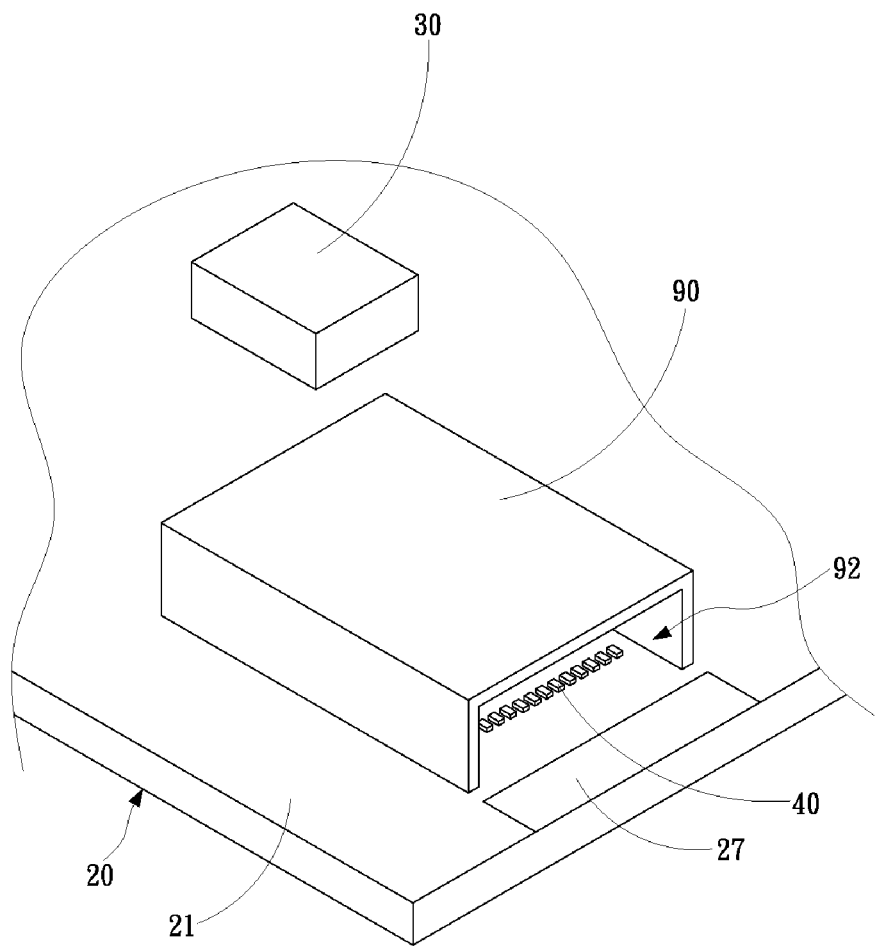
FIG. 5 is a first diagram showing a protection layer according to the first embodiment of this invention.

FIG. 5 is a first diagram showing a protection layer according to the first embodiment of the invention. The circuit board 20 further includes a protection layer 27 disposed at the surface of the static induction portion 23 of the circuit board 20. The protection layer 27 is preferably made of an anti-oxidation conductive material, such as tin, aluminum, gold, or other alloys. In the embodiment, the protection layer 27 may be a tin grease layer coated on the surface of the static induction portion 23.

Figure 6:
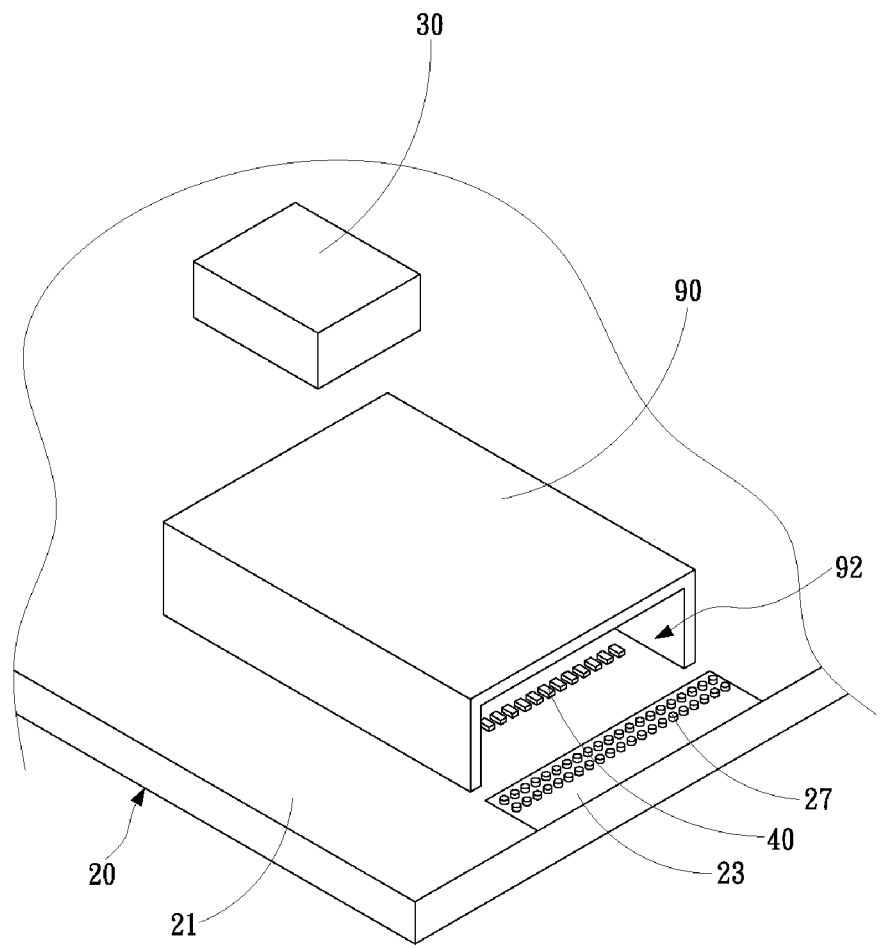
FIG. 6 is a second diagram showing the protection layer according to the first embodiment of this invention.

FIG. 6 is a second diagram showing a protection layer according to the first embodiment of the invention. Besides coating and covering the surface of the static induction portion 23, the protection layer 27 can be tin balls disposed on the surface of the static induction portion 23 at intervals.

Figure 7:
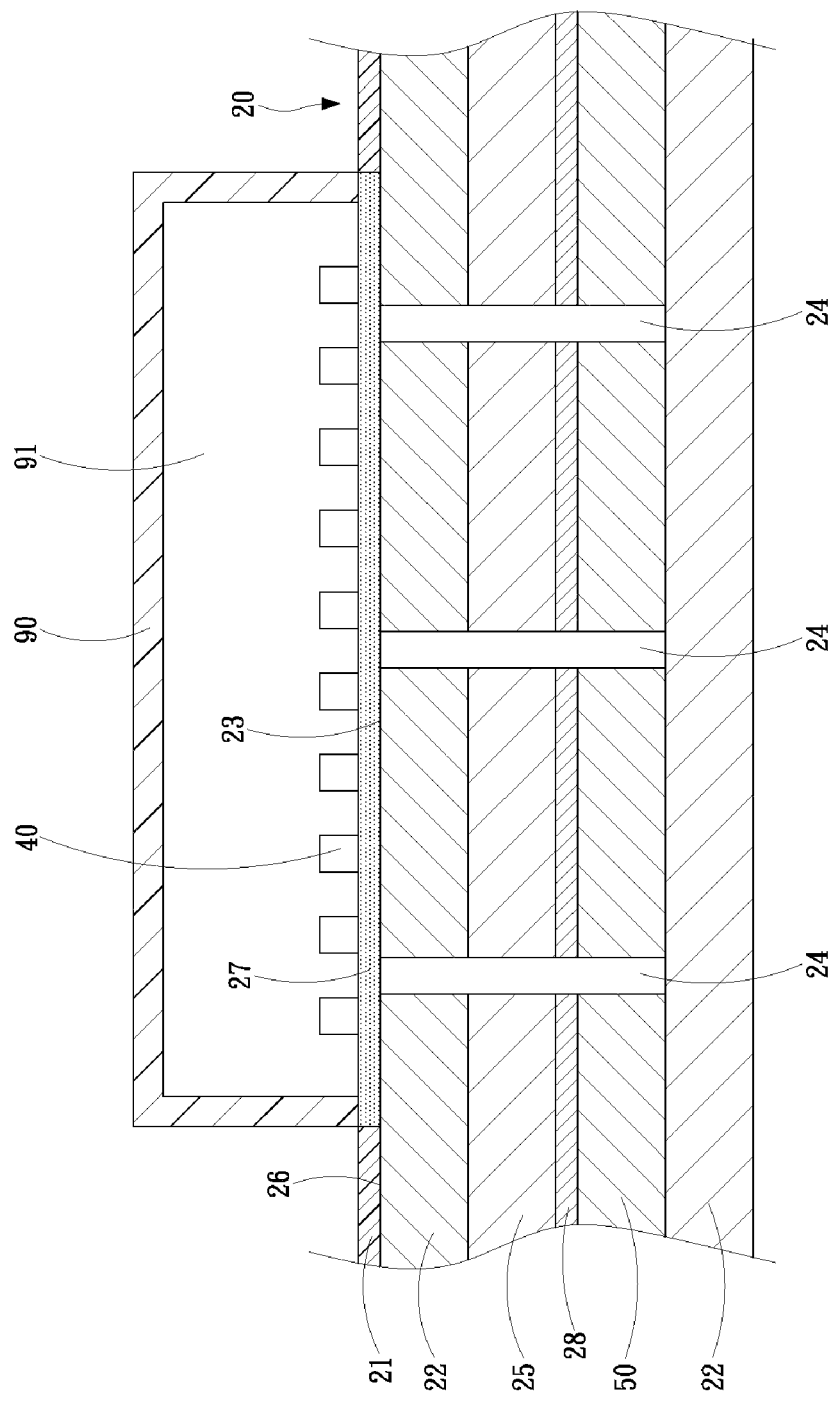
FIG. 7 is a front view showing a circuit board according to the first embodiment of this invention.

FIG. 7 is a front view showing the circuit board according to the first embodiment of the invention. The circuit board 20 further includes a medium insulating layer 28 located between the conductive layer 22 and the ground layer 50. The circuit board 20 includes at least one plated through hole 24. The number of the plated through hole 24 is preferably a plurality, and the plated through holes 24 are formed at the static induction portion 23 with the same interval. However, the invention is not limited thereto. The plated through hole 24 is formed at the static induction portion 23 and passes through the medium insulating layer 28 to electrically connect the static induction portion 23 and the ground layer 50, such that the static electricity can be quickly conducted to the ground layer 50 via the static induction portion 23 of the conductive layer 22. In one preferred embodiment, when the number of the plated through hole 24 is a plurality, each of the plated through holes 24 are formed at the static induction portion 23 with the same interval, and the interval is at least five mileages.

The circuit board 20 further includes the power layer 25. The power layer 25 is a rectangular sheet and is electrically connected with the electronic element 30. Via electrical connection of the power layer 25 and the electronic element 30, the power layer 25 provides power to drive the electronic element 30. In FIG. 7, in the embodiment, the power layer 25 is sandwiched between the conductive layer 22 and the ground layer 50. Therefore, the plated through hole 24 also passes through the power layer 25, and the power layer 25 is preferably made of copper foil. However, the invention is not limited thereto. The power layer 25 may also be made of other conductive materials.

Figure 8:
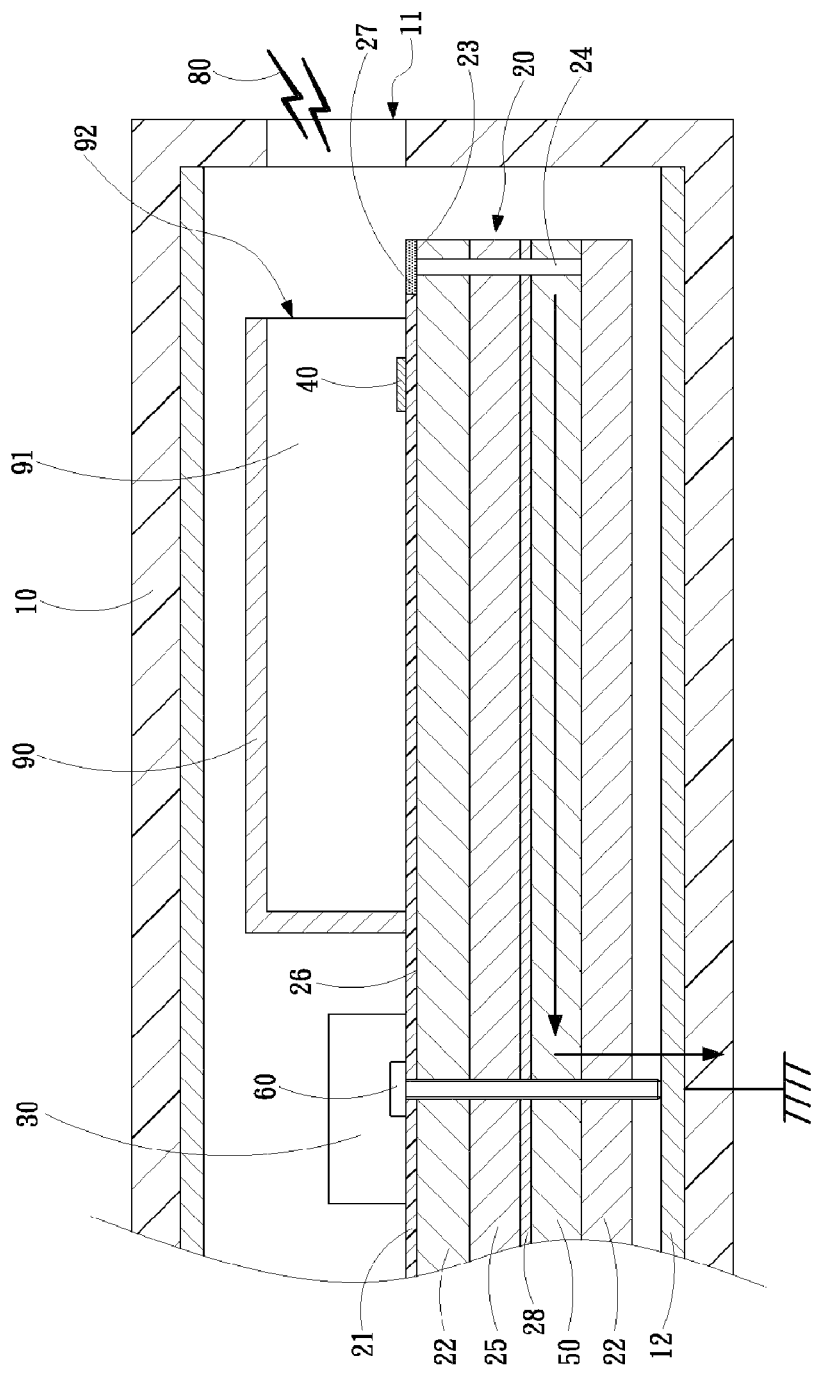
FIG. 8 is an operation diagram according to the second embodiment of this invention.

FIG. 8 is an operation diagram according to the second embodiment of the invention. In the embodiment, the electronic device further includes a fastening element 60. The fastening element 60 passes through the conductive layer 22, the medium insulating layer 28, and the ground layer 50 in order to fasten the circuit board 20 to the casing 10. The fastening element 60 is preferably a screw made of a conductive material, such as metal. However, the invention is not limited thereto. The fastening element 60 may be made of other materials.

When a user uses the electronic device in the embodiment of the invention, static electricity 80 may be generated due to the contact of the user to the electronic device and be conducted to the casing 10 via the opening 11. When the static electricity 80 is conducted into the casing 10, since the static induction portion 23 of the conductive layer 22 is closer to the opening 11 of the casing 10 than the pins 40, the static electricity 80 first contacts the static induction portion 23 after entering into the casing 10. Further, since the static induction portion 23 is not covered by the surface insulating layer 21, the static electricity 80 may be lead off via the static induction portion 23 to prevent the static electricity 80 from hitting the pins 40 and from damaging the electronic element 30 and related circuits by being conducted to the electronic element 30 via an electronic connecting cable (not shown) on the conductive layer 22. In addition, the plated through hole 24 corresponds to the static induction portion 23 of the conductive layer 22 to connect the conductive layer 22 and the ground layer 50, such that the static electricity 80 can be quickly conducted to the ground layer 50 via the static induction portion 23 of the conductive layer 22.

In addition, in the second embodiment, the casing 10 has a sprayed layer 12. The static electricity 80 can be conducted from the ground layer 50 to the sprayed layer 12 of the casing 10 via the fastening element 60 to release the static electricity. The sprayed layer 12 may be made of copper or tin. However, the invention is not limited thereto.

According to the electronic device in the embodiments of the invention, the exposed static induction portion of the conductive layer of the circuit board without coating the surface insulating layer is disposed between the pins on the circuit board and the opening of the casing, thereby being closer to the opening of the casing than the pins. When negative electric charges of the static electricity exist around the electronic device, the static electricity may be discharged to the ground layer along the static induction portion adjacent to the opening, thus to protect the electronic element on the circuit board free from damage caused by discharge of the static electricity. In addition, the conductive cloth is not disposed in the casing according to this design, disadvantages in the prior art that the conductive cloth is exposed to the opening of the casing and the assembly of the conductive cloth is inconvenient can be solved, further to reduce the material costs and the assembling costs of the electronic device.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An electronic device comprising:
    a casing having an opening;
    a circuit board located in the casing, the circuit board including:
        a conductive layer including a static induction portion and a signal transmission portion, the static induction portion electrically disconnected with the signal transmission portion at the conductive layer, wherein the static induction portion and the signal transmission portion are disposed at the same layer of the conductive layer and the static induction portion is closer to the opening than the signal transmission portion; and
        a surface insulating layer covering the signal transmission portion on the circuit board and exposing the static induction portion;
    wherein a static electricity is conducted through the static induction portion without hitting a plurality of pins electrically connected with the signal transmission portion.

2. The electronic device according to claim 1, wherein the circuit board further comprises:
    a ground layer; and
    a medium insulating layer located between the conductive layer and the ground layer,
    at least one plated through hole being formed at the static induction portion and passing through the medium insulating layer to electrically connect the static induction portion and the ground layer.

3. The electronic device according to claim 2, wherein the number of the plated through hole is a plurality, and the plated through holes are formed at the static induction portion with the same interval.

4. The electronic device according to claim 3, wherein the interval is at least five mileages.

5. The electronic device according to claim 2, further comprising a fastening element, the fastening element passing though the conductive layer, the medium insulating layer, and the ground layer in order to fasten the circuit board to the casing.

6. The electronic device according to claim 1, further comprising:
    the plurality of pins disposed on the surface insulating layer; and
    an electronic element disposed on the surface insulating layer and electrically connected with the pins via a signal cable.

7. The electronic device according to claim 6, further comprising:
    a power layer electrically connected with the electronic element to provide power to drive the electronic element.

8. The electronic device according to claim 1, wherein the surface insulating layer is made of oil ink.

9. The electronic device according to claim 1, further comprising a protection layer disposed on a surface of the static induction portion of the circuit board.

10. The electronic device according to claim 9, wherein the protection layer is made of tin.

11. The electronic device according to claim 9, wherein the protection layer is disposed on the surface of the static induction portion at intervals.

12. The electronic device according to claim 1, further comprising a cover disposed on the circuit board to form a containing space, one opening of the containing space corresponding to the opening of the casing, to allow an electronic card to be inserted via the opening of the casing and be contained in the containing space.

* * * * *